United States Patent
Clarke et al.

(10) Patent No.: US 11,854,879 B2
(45) Date of Patent: Dec. 26, 2023

(54) $Cu_3Sn$ VIA METALLIZATION IN ELECTRICAL DEVICES FOR LOW-TEMPERATURE 3D-INTEGRATION

(71) Applicant: Raytheon Company, Waltham, MA (US)

(72) Inventors: Andrew Clarke, Santa Barbara, CA (US); John J. Drab, Arroyo Grande, CA (US); Faye Walker, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 217 days.

(21) Appl. No.: 17/184,756

(22) Filed: Feb. 25, 2021

(65) Prior Publication Data

US 2021/0265206 A1 Aug. 26, 2021

Related U.S. Application Data

(60) Provisional application No. 62/982,020, filed on Feb. 26, 2020.

(51) Int. Cl.
  *H01L 21/768* (2006.01)
  *H01L 23/522* (2006.01)
  (Continued)

(52) U.S. Cl.
  CPC .. *H01L 21/76883* (2013.01); *H01L 21/76802* (2013.01); *H01L 21/76886* (2013.01);
  (Continued)

(58) Field of Classification Search
  CPC ......... H01L 21/76883; H01L 21/76802; H01L 21/76886; H01L 23/5226; H01L 23/528;
  (Continued)

(56) References Cited

U.S. PATENT DOCUMENTS 6,902,987 B1   6/2005   Tong et al.
8,709,938 B2   4/2014   Enquist et al.
(Continued)

FOREIGN PATENT DOCUMENTS

EP    3185290      6/2017
JP    2007277715   10/2007
(Continued)

OTHER PUBLICATIONS

Beilliard et al "Advances Toward Reliable High Density Cu—Cu Interconnects by Cu—SiO2 Direct Hybrid Bonding," 2014 International 3D Systems Integration Conference (3DIC), Dec. 1, 2014.
(Continued)

*Primary Examiner* — Thanh T Nguyen
(74) *Attorney, Agent, or Firm* — Renner, Otto, Boisselle & Sklar

(57) ABSTRACT

A $Cu_3Sn$ electrical interconnect and method of making same in an electrical device, such as for hybrid bond 3D-integration of the electrical device with one or more other electrical devices. The method of forming the $Cu_3Sn$ electrical interconnect includes: depositing a Sn layer in the via hole; depositing a Cu layer atop and in contact with the Sn layer; and heating the Sn layer and the Cu layer such that the Sn and Cu layers diffuse together to form a $Cu_3Sn$ interconnect in the via hole. During the heating, a diffusion front between the Sn and Cu layers moves in a direction toward the Cu layer as initially deposited, such that any remaining Cu layer or any voids formed during the diffusion are at an upper region of the formed $Cu_3Sn$ interconnect in the via hole, thereby allowing such voids or remaining material to be easily removed.

20 Claims, 8 Drawing Sheets

(51) Int. Cl.
    *H01L 23/528*     (2006.01)
    *H01L 23/532*     (2006.01)

(52) U.S. Cl.
    CPC ........ *H01L 23/528* (2013.01); *H01L 23/5226* (2013.01); *H01L 23/53233* (2013.01)

(58) Field of Classification Search
CPC ... H01L 23/53233; H01L 24/06; H01L 24/08; H01L 24/09; H01L 2224/03462; H01L 2224/03464; H01L 2224/0361; H01L 2224/03845; H01L 2224/05073; H01L 24/03; H01L 2224/03416; H01L 2224/0345; H01L 2224/03452; H01L 2224/03622; H01L 2224/03848; H01L 2224/039; H01L 2224/04; H01L 2224/05027; H01L 2224/0508; H01L 2224/05082; H01L 2224/05111; H01L 2224/05568; H01L 2224/05576; H01L 2224/05647; H01L 2224/05687; H01L 2224/05688; H01L 2224/06181; H01L 2224/08145; H01L 2224/09181; H01L 2224/80013; H01L 2224/80203; H01L 2224/80204; H01L 2224/8083; H01L 2224/80895; H01L 2224/80896; H01L 2224/80905; H01L 2224/80906; H01L 2924/00015; H01L 2924/10379; H01L 2924/3656; H01L 21/76843; H01L 21/76858; H01L 21/76864; H01L 21/76873; H01L 24/05; H01L 24/80

See application file for complete search history.

(56) References Cited

U.S. PATENT DOCUMENTS

| | | | |
|---|---|---|---|
| 2015/0091162 A1* | 4/2015 | Murayama | H01L 24/81 257/737 |
| 2017/0103942 A1* | 4/2017 | Oi | H01L 24/81 |
| 2017/0194283 A1* | 7/2017 | Dubey | H01L 24/06 |

FOREIGN PATENT DOCUMENTS

| | | | | |
|---|---|---|---|---|
| KR | 20040001988 | * | 8/2004 | ....... H01L 21/76864 |
| WO | 2019/125404 | | 6/2019 | |

OTHER PUBLICATIONS

International Search Report and Written Opinion dated Jun. 7, 2021 in corresponding International Application No. PCT/US2021/019592.

* cited by examiner

CU₃SN VIA METALLIZATION IN ELECTRICAL DEVICES FOR LOW-TEMPERATURE 3D-INTEGRATION

RELATED APPLICATIONS

This application claims the benefit of U.S. Provisional Application No. 62/982,020 filed Feb. 26, 2020, which is hereby incorporated herein by reference.

TECHNICAL FIELD

The present disclosure relates generally to three-dimensionally integrated electrical devices, and more particularly to $Cu_3Sn$ via metallization of the electrical interconnect structures utilized for electrically connecting together such three-dimensionally integrated devices.

BACKGROUND

Electrical devices, such as semiconductor integrated circuits (ICs) or other semiconductor devices, are typically fabricated into and/or on a substrate, such as a silicon wafer, resulting in an IC area that generally increases in size and density as the complexity of the IC increases. One trend in recent IC fabrication has been to increase the number and/or different types of ICs by vertically stacking and vertically interconnecting the ICs together. Generally, each of the vertically stacked ICs can be of different sizes, come from different size wafers, have different functions, be made of different materials, etc.

One conventional method for realizing the approach of vertically stacking ICs is through a hybrid bond process in which vertical electrical interconnect structures, commonly referred to as vias, are thermo-compressively bonded together while the surrounding oxide layers are direct oxide bonded together between individually stacked IC wafers. This approach may be accomplished by using conventional wafer fabrication techniques, including wafer thinning, chemical-mechanical polishing, photolithography masking, via etching and deposition, and electrical interconnect and electrical trace deposition. The vertical electrical interconnection between stacked ICs can be formed as a result of the hybrid bond stacking, or as a result of a sequence of wafer fabrication techniques after hybrid bonded stacking.

A typical hybrid bond process provides an electrical device substrate, such as a semiconductor IC wafer, which has a bonding layer and vertical interconnects extending through the bonding layer. The vertical interconnects are electrically connected to electrical traces disposed on the substrate, which provide an electrical path to circuits or electronic devices on the substrate. During the hybrid bond process, the bonding layer of one electrical device is contacted with the bonding layer of another electrical device, whereby a chemical bond may occur with or without temperature treatment to bind the two electrical devices together. In addition, exposed portions of the vertical interconnects of the first electrical device typically are contacted with the vertical interconnects of the second electrical device to enable an electrical coupling between the electrical devices in the vertically stacked electrical device assembly. Commonly, after the desired number of individual electrical devices have been vertically stacked, the stacked electrical device assembly undergoes a temperature treatment to cause the vertical metal interconnects from the respective stacked electrical devices to diffuse together resulting in an electrical connection.

SUMMARY

In conventional hybrid bond processing for the 3D integration of electrical devices, the bond between the individual electrical devices at their respective bonding layers (e.g., silicon dioxide layers) usually is established at 150° C., however, the fusion bonding of the respective vertical metal interconnect structures (e.g., nickel or copper) often requires a high-temperature anneal in excess of 300° C. to establish a reliable electrical connection. Some conventional 3D-integrated electrical devices, such as infrared detectors, include temperature sensitive materials, such as HgCdTe (HCT), in which this high-temperature anneal (e.g., 300° C.) for thermo-compressive bonding of the interconnects is unacceptable due to degradation of the HCT material at these high temperatures. Moreover, the high-temperature fusion bond process may cause cracking and bond failures between electrical devices having varying coefficients of thermal expansion between the different materials utilized in such devices, such as between the silicon and fused silica used in such structures. Accordingly, there is a need in the art for an improved electrical interconnect material and via metallization process for forming the interconnect structure in the electrical device at low temperatures (e.g., 200° C.), which also enables fusion bonding/thermo-compressive bonding between these interconnect structures at such low temperatures, while also being compatible with conventional IC fabrication processes, among other considerations.

An aspect of the present disclosure provides such an electrical interconnect structure that is made of a copper-tin intermetallic compound, specifically $Cu_3Sn$, which addresses one or more needs in the art.

More specifically, the exemplary $Cu_3Sn$ interconnect material is an intermetallic compound having suitable material properties for enabling low-temperature hybrid bond processing of 3D-integrated electrical devices, such as semiconductor ICs. For example, the $Cu_3Sn$ material may be formed in via holes of the electrical device at temperatures less than 200° C., or more preferably less than 150° C. In addition, the $Cu_3Sn$ material may form reliable fusion bonds with the $Cu_3Sn$ interconnect structures of other electrical devices at temperatures less than 200° C., or more preferably less than 150° C. Thus, when used with suitable low-temperature bonding layer materials (e.g., silicon dioxide) in 3D integrated devices, the $Cu_3Sn$ material may enable individual electrical device formation and complete hybrid bond processing at temperatures of 150° C. or less, which is well below that of conventional interconnect materials (e.g., Cu and Ni) that generally require fusion bond treatment at 300° C. This, in turn, enables a wider variety of materials that can be used with such hybrid bond processing. For example, the use of such a $Cu_3Sn$ material may enable temperature-sensitive materials such as HgCdTe (HCT) to be used in the 3D-integrated device, thus enabling electrical devices such as infrared detectors to be vertically integrated using hybrid bond processing techniques.

The $Cu_3Sn$ material also includes other properties that make it suitable for use in such 3D-integrated devices. For example, the $Cu_3Sn$ material has acceptable electrical conductivity that is similar to that of other conventional interconnect materials such as nickel (Ni). In addition, the $Cu_3Sn$ material exhibits high resistance to corrosion, which may reduce the growth of native oxides and other reaction byproducts that may be formed at the fusion bonding interface of the interconnect structure due to processing steps such as chemical-mechanical polishing (CMP). Furthermore, $Cu_3Sn$ has a higher coefficient of thermal expansion (CTE) than that of copper (Cu) or nickel (Ni), which may facilitate the thermo-compressive bonding process between $Cu_3Sn$ interconnect structures at the relatively low temperatures of 200° C. For example, the higher CTE of the $Cu_3Sn$ material may enhance exposure of the interconnect structure relative to the bonding layer during interconnect fusion processing, and also may increase the contact pressure between opposing $Cu_3Sn$ interconnects due to such thermal expansion, which may thereby facilitate inter-diffusion between the interconnect structures of the opposing stacked electrical devices.

Another aspect of the present disclosure provides a unique method of forming the $Cu_3Sn$ material as an interconnect structure within the electrical device.

More specifically, the present inventors discovered that the sequence of steps used for forming the $Cu_3Sn$ interconnect structure in a via hole of an electrical device is a factor in providing a suitable interconnect structure. In particular, the present inventors experimented with different ways to form the $Cu_3Sn$ material by using low-temperature solid-state diffusion between individually deposited layers of Sn and Cu. The experimental results showed that solid-state diffusion between Cu and Sn is dominated by the rate of Cu diffusion into the Sn layer, thus resulting in a diffusion front that moves in the direction of the Cu layer. This solid-state diffusion is understood to be a vacancy diffusion mechanism, and because the diffusion rate of Cu into Sn is greater than that of Sn into Cu, Kirkendall voids were found to appear at the diffusion front between the Cu layer and the formed $Cu_3Sn$ layer. The presence of these voids may reduce the functionality of the interconnect structure when they appear in areas that may cause mechanical weakening and/or reduce the electrical conductivity of the interconnect structure. In particular, the present inventors found that when the Sn layer is deposited over the Cu layer in the via hole, solid-state diffusion between the Sn and Cu layers caused by heating could result in Kirkendall voids being formed deep within the via hole which were not removable by conventional processing techniques such as CMP.

According to an aspect of the present disclosure, the present inventors discovered that by first depositing the Sn layer into the via hole and then depositing the Cu layer atop the Sn layer, the direction of Cu diffusion across the diffusion front when heated will enable the $Cu_3Sn$ material to form in the via hole, while the diffusion front with any Kirkendall voids will move away from the formed $Cu_3Sn$ material toward the remaining Cu layer (e.g., above the via hole) where the voids and remaining material can then be removed, such as by CMP. The present inventors discovered that the $Cu_3Sn$ material will form by bulk solid-state diffusion using such a process when heating the Sn and Cu layers to a temperature as low as 100° C. Thus, such a process for forming a $Cu_3Sn$ interconnect structure, when combined with other conventional 3D integration processes such as oxide layer bonding, CMP, plasma activation, etc., in addition to the low-temperature fusion bonding of the interconnect structures provided by the $Cu_3Sn$ material, may enable an entire hybrid bond process between integrated electrical devices to be accomplished under a temperature of 200° C., and more preferably at 150° C. or less. Thus, such an approach may enable a greater variety of materials (e.g., HCT) and/or devices (e.g., infrared sensors) to be used in such 3D integration techniques.

According to an aspect of the present disclosure, a method of forming an electrical interconnect in a via hole of an electrical device includes: depositing a Sn layer in the via hole; depositing a Cu layer atop and in contact with the Sn layer; and heating the Sn layer and the Cu layer such that the Sn and Cu layers diffuse together to form a $Cu_3Sn$ interconnect in the via hole; wherein during the heating, a diffusion front between the Sn and Cu layers moves in a direction toward the Cu layer initially deposited.

According to another aspect of the present disclosure, a method of making an electrical device includes: providing a substrate; forming an electrically conductive trace at least partially overlying the substrate; forming a bonding layer at least partially overlying the electrically conductive trace; forming a via hole in the bonding layer; and forming a $Cu_3Sn$ interconnect in the via hole according to the foregoing method.

According to another aspect of the present disclosure, a method of making a 3D-integrated electrical device assembly includes: making at least two electrical devices according to the foregoing method; and bonding the at least two electrical devices together at their respective bonding layers.

According to another aspect of the present disclosure, a method of forming an electrical device includes: forming a first $Cu_3Sn$ interconnect on a first electrical device subassembly; forming a second $Cu_3Sn$ interconnect on a second electrical device subassembly; and coupling the first $Cu_3Sn$ interconnect to the second $Cu_3Sn$ interconnect.

According to another aspect of the present disclosure, an electrical device includes: a substrate; an electrically conductive trace at least partially overlying the substrate; an electrically conductive interconnect disposed in a via hole, wherein the electrically conductive interconnect is electrically connected to the trace; and a bonding layer at least partially surrounding the interconnect and at least partially overlying the substrate; wherein the electrically conductive interconnect is made of $Cu_3Sn$.

According to another aspect of the present disclosure, an electrical device includes: a first electrical device section having a first $Cu_3Sn$ interconnect; and a second electrical device section having a second $Cu_3Sn$ interconnect; wherein the first $Cu_3Sn$ interconnect is coupled to the second $Cu_3Sn$ interconnect to form a single $Cu_3Sn$ interconnect structure.

Another aspect of the present disclosure provides a $Cu_3Sn$ electrical structure for an electronic device.

Another aspect of the present disclosure provides a method of forming a $Cu_3Sn$ electrical structure for an electronic device.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects according to the present disclosure.

DETAILED DESCRIPTION

The principles and aspects according to the present disclosure have particular application to electrical devices, such as integrated circuit (IC) devices, and more particularly vertically integrated semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide a $Cu_3Sn$ structure and/or a low-temperature process for forming such $Cu_3Sn$ structures. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to vertically integrating both active and passive electrical devices.

Figure 1A:
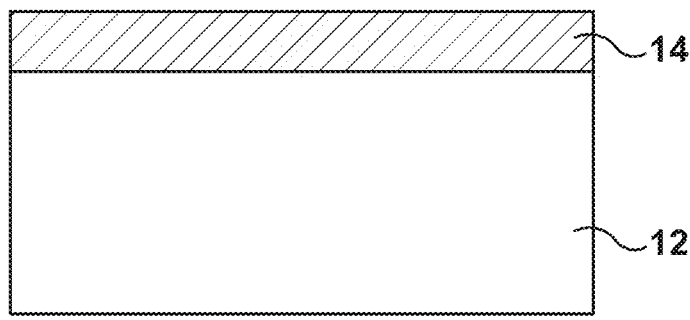
FIGS. 1A-1I are schematic cross-sectional views depicting exemplary process steps of forming an exemplary electronic device according to an embodiment of the present disclosure.
Figure 1B:
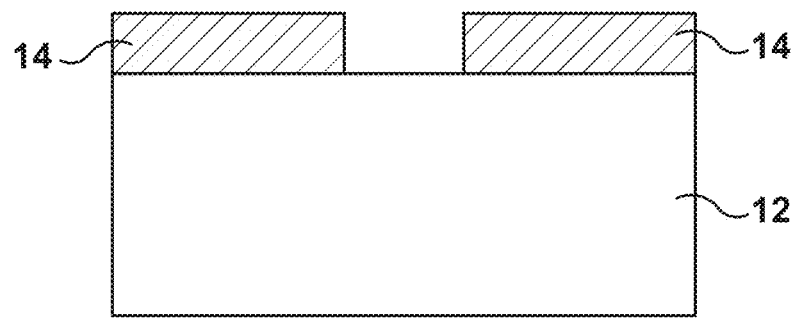
Figure 1C:
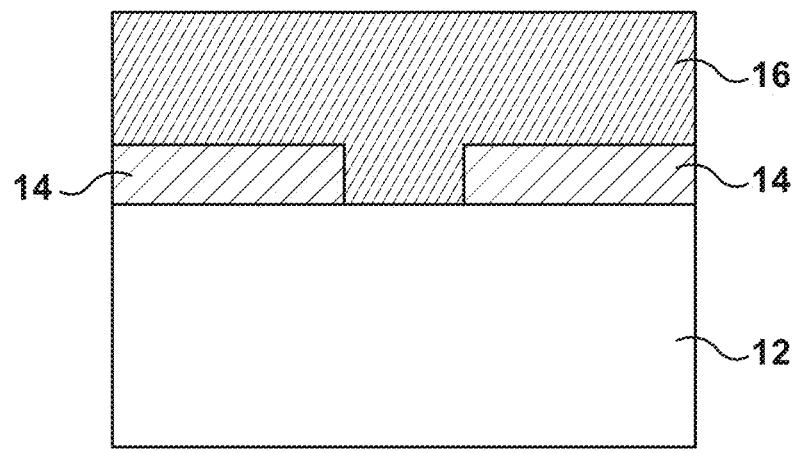
Figure 1D:
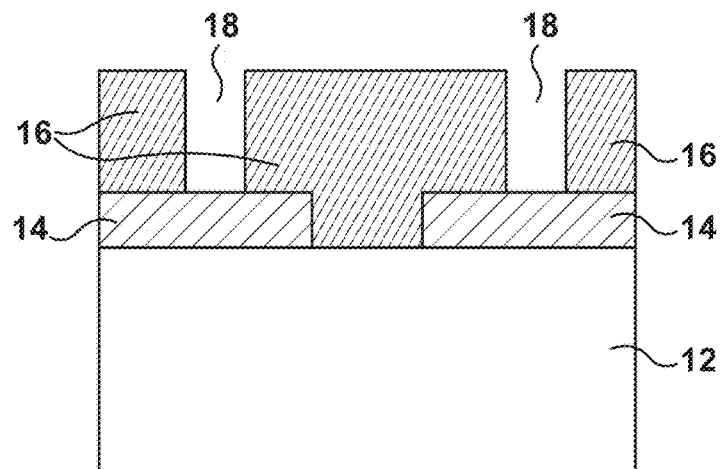
Figure 1E:
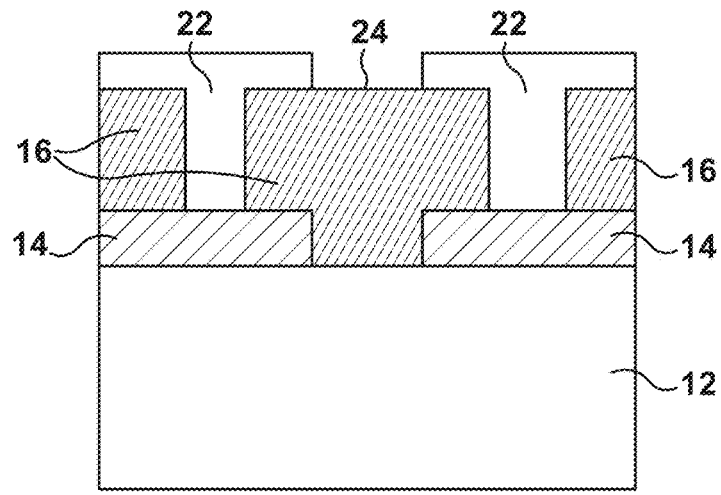
Figure 1F:
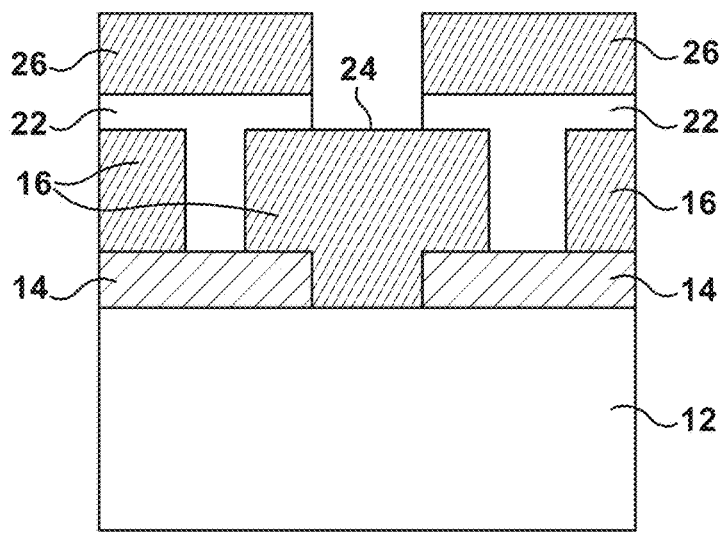
Figure 1G:
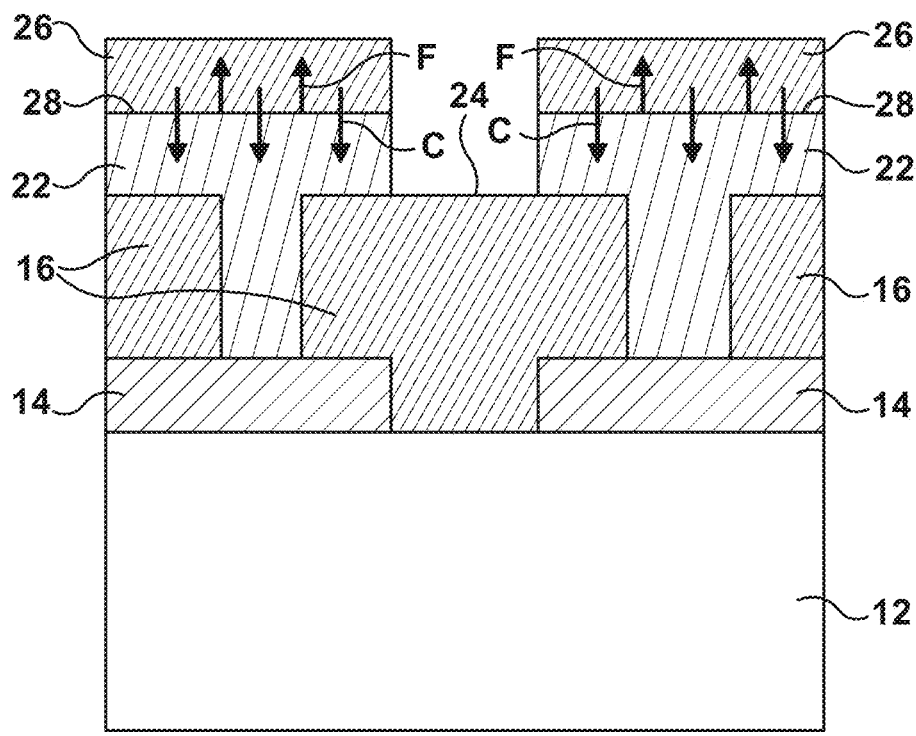
Figure 1H:
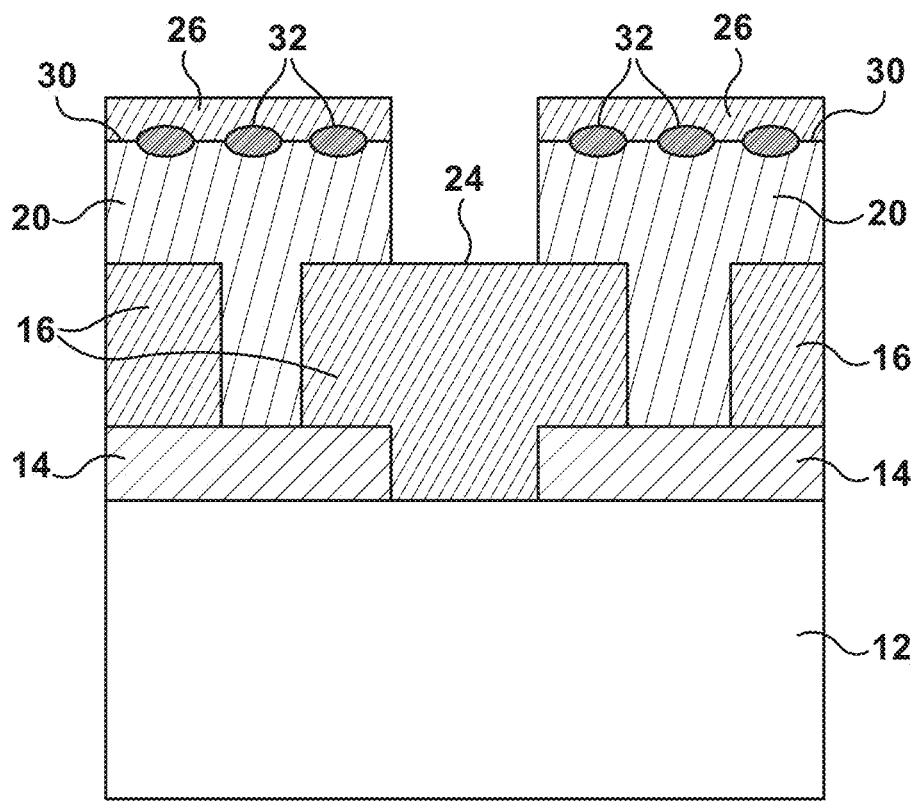
Figure 1I:
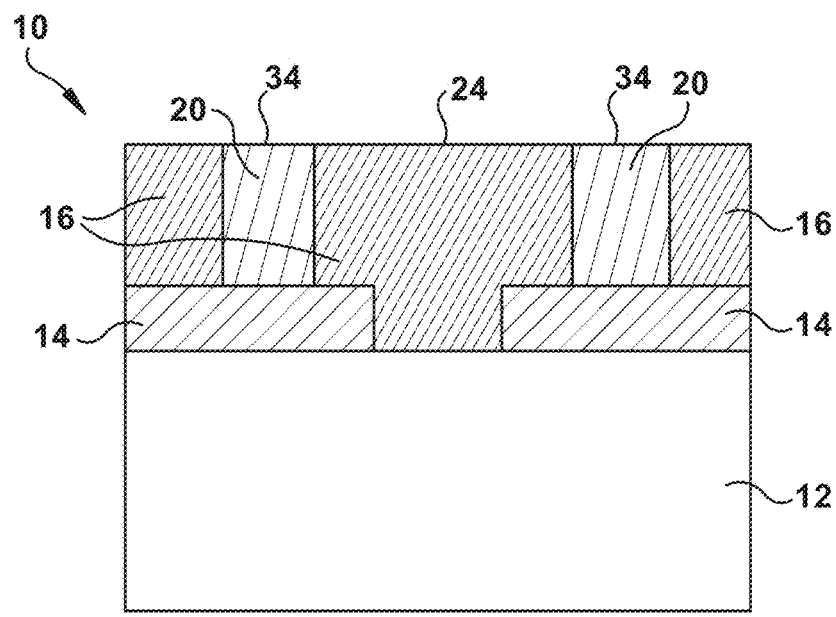

In the discussion above and to follow, the terms "upper", "lower", "top", "bottom," "left," "right," "horizontal," "vertical," etc. refer to an exemplary electrical device as viewed in a horizontal position, as shown in FIG. 1I, for example. This is done realizing that these devices can be oriented in various other positions when manufactured, when implemented in other electrical devices, when packaged, and the like.

FIGS. 1A-1I show an exemplary method of forming an exemplary electrical device, including an exemplary method of forming a $Cu_3Sn$ interconnect structure (FIGS. 1E-1I). In the illustrated embodiment, the electrical device 10 may be a semiconductor device or any other suitable electrical device. Referring initially to FIG. 1A, a substrate 12 is provided, and an electrically conductive trace 14 is formed overlying at least a portion of an upper planar surface of the substrate 12. The substrate 12 may be made of silicon or III-V materials. The trace 14 may be made of an electrically conductive metal or alloy, such as aluminum or aluminum alloys, copper or copper alloys, or gold. The trace 14, or trace layer, may be formed on the substrate 12 in any suitable manner well-known in the art, such as by a deposition process, which may include physical vapor deposition, chemical vapor deposition, plasma enhanced chemical vapor deposition, vapor phase deposition, electroplating, sputtering, or the like. The trace 14 may be deposited directly onto the substrate 12, or the trace 14 may be deposited onto an adhesion layer (not shown) that is first deposited directly onto the substrate 12 to promote adhesion of the trace 14 to the substrate 12. In this manner, it is understood that the term "disposed on," "disposed onto," "overlying," or the like, as used herein, refers to direct or indirect contact of one element with another element, whereas the term "directly on" or "directly onto" refers to direct contact of one element with another element, but not indirect contact between elements.

After depositing the electrical trace layer, the trace 14 may be patterned (as shown in FIG. 1B) to provide discrete electrical paths across the electrical device 10. For example, the trace 14 may be patterned into discrete segments by utilizing conventional photolithographic patterning and/or etching techniques. The trace layer 14 may be segmented in such a way so as to provide discrete electrical paths that contact and electrically interconnect devices or circuit structures (not shown) that are formed on and/or in the substrate 12. The substrate 12 also may contain an integrated circuit, active or passive electrical or electronic devices, etc. to which the trace or traces 14 are connected.

As shown in FIG. 1C, a bonding layer 16 is deposited along at least a portion of the upper surface of the electrical device to at least partially overlie and/or cover the trace 14. The bonding layer 16 may be a conformal dielectric film. The bonding layer 16 may be a non-metallic material, such as an oxide, such as a silicon oxide, for example silicon dioxide (e.g., fused silica). The bonding layer 16 may be formed by any suitable technique, such as a deposition process, including physical vapor deposition, chemical vapor deposition, plasma enhanced chemical vapor deposition, sputtering, or a spin-on glass process.

Referring to FIG. 1D, one or more via holes 18 are shown as being formed in the bonding layer 16. The via holes 18 may be formed in the bonding layer 16 in any suitable manner as would be understood by those having ordinary skill in the art. For example, a photoresist layer (not shown) may be deposited along at least a portion of the upper surface of the bonding layer 16. The photoresist layer may be deposited according to conventional methods well known in the art, for example by spin coating, to produce a relatively uniform layer. The one or more via holes 18 (also referred to as channels, cavities, or the like) may be formed in the photoresist layer and bonding layer 16 using conventional photolithographic patterning and/or etching techniques. For example, a photomask having the desired pattern for forming the via holes 18 may be placed over the photoresist layer, and UV light may be directed through the mask holes to expose those portions of the photoresist layer corresponding to the via holes 18. Thereafter, the photoresist layer may be developed in a conventional manner to remove those portions of the photoresist layer exposed to the UV light, whereby the via holes 18 may be formed.

The via hole(s) 18 are used for forming vertical electrical interconnect structure(s) 20, commonly referred to as vias, in the device 10 (as shown in FIG. 1I, for example, and described in further detail below). As shown, these interconnects 20 may extend vertically through one or more horizontal planes of the electrical device 10. Generally, the interconnect(s) 20 may have any suitable configuration for electrically (or thermally) interconnecting structures on the different horizontal planes of the device 10. The interconnects 20 may be distributed uniformly or may be scattered in a predetermined pattern horizontally and/or vertically across the device 10. In the illustrated embodiment, for example, the interconnects 20 are configured as blind vias with one side exposed and the opposite side contacting the electrical trace 14 to provide an electrical connection. Alternatively or additionally, the interconnects 20 may include through-hole or through-circuit vias that extend from one side of the device 10 or substrate 12 to the opposite side of the device 10 or substrate 12. Alternatively or additionally, the interconnects 20 may include buried vias that connect internal layers of the device 10 without being exposed on either surface of the device 10. Alternatively or additionally, the interconnect may be formed in a castellated via hole at the edge of the device 10 such as for allowing the electrical device 10 to be connected to a horizontally adjacent device, for example.

In exemplary embodiments, one or more (or all) of the electrical interconnects 20 are made of $Cu_3Sn$ material. Referring to Table 1, below, some exemplary properties of the $Cu_3Sn$ material are shown compared to conventional interconnect materials, Cu and Ni. As shown, the $Cu_3Sn$ material exhibits some properties that are similar to the conventional Cu and Ni materials. For example, the $Cu_3Sn$ material has an electrical resistivity and thermal conductivity that is similar to that of Ni, suggesting that it is suitable for use in electrically (or thermally) connecting together structures in the electrical device 10. In addition, the $Cu_3Sn$ material has a Vickers hardness and Young's modulus that is similar to that of Cu, suggesting that it may be chemically-mechanically polished without significant smearing or other deleterious effects.

TABLE 1

| Property | Cu | Ni | $Cu_3Sn$ |
| --- | --- | --- | --- |
| Vicker's hardness, $Kg/mm^2$ | 369 | 638 | 343 |
| Youngs Modulus, Gpa | 121-133 | 200 | 108 |
| Poisson's Ratio | 0.34-0.35 | 0.31 | 0.299 |
| CTE, PPM/C | 17.1 | 13.4 | 19.0 |
| Heat Capacity, J/g/K | .372-.388 | 0.44 | 0.326 |
| Resistivity, micro-Ohm-cm | 1.82 | 6.93 | 8.93 |
| Density, g/cc | 8.9 | 8.908 | 8.9 |
| Thermal Conductivity, watt/cm-K | 1.47-3.70 | 0.91 | 0.74 |
| Melting Temperature, Kelvin | 1358 | 1728 | 945 |
| $E_A$ for Self-Diffusion | 1.2 | 3.03 | 0.66 |

The $Cu_3Sn$ material also includes properties that are advantageous over the conventional interconnect materials Cu or Ni, as shown in Table 1. For example, the activation energy for self-diffusion in $Cu_3Sn$ is significantly lower than that of Cu (2.13 eV) or Ni. Thus, the $Cu_3Sn$ material is expected to form reliable fusion bonds with the $Cu_3Sn$ interconnect structures in other electrical devices (e.g., FIG. 2) at significantly lower temperature than Cu or Ni, which usually require post-temperature annealing between 300° C.-350° C., with the higher temperatures in this range being exacerbated by the formation of stable native oxides at the fusion bond interface. The $Cu_3Sn$ material, on the other hand, exhibits high corrosion resistance, which may reduce the growth of native oxides and other reaction byproducts that can form during processing, such as during the CMP step (e.g., FIG. 1, described below). The minimization of such oxides at the $Cu_3Sn$ interconnect interface may thereby facilitate inter-diffusion bonding at lower temperatures (e.g., about 150° C. or less). The ability to form such fusion bonds at these relatively low temperatures enables a wider variety of materials that can be used with hybrid bond processing of such a device 10. For example, the use of such a $Cu_3Sn$ material may enable temperature-sensitive materials such as HgCdTe (HCT) to be used in the 3D-integrated IC device, thus enabling electrical devices such as infrared detectors to be vertically integrated using the exemplary $Cu_3Sn$ interconnect structures 20.

Figure 2:
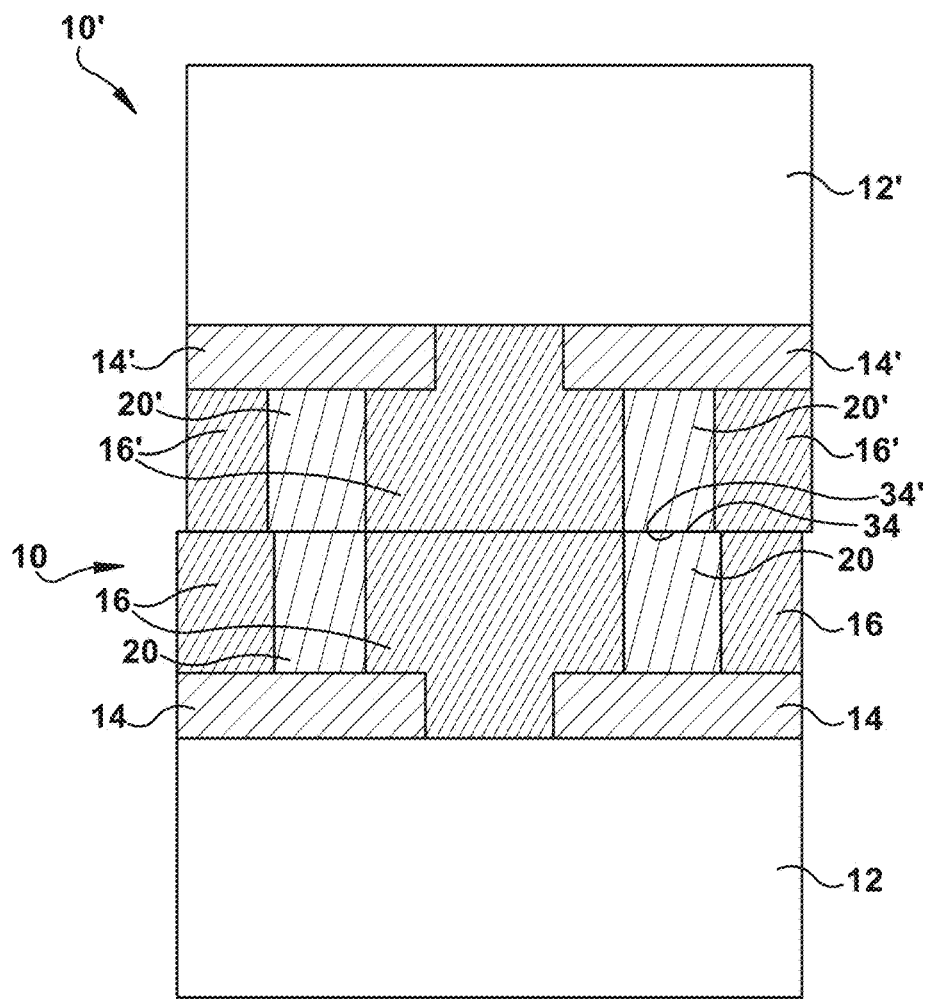
FIG. 2 is a schematic cross-sectional view depicting an exemplary process steps of stacking the electronic device of FIG. 1I with another exemplary electronic device.

In addition, the $Cu_3Sn$ material has a higher coefficient of thermal expansion (CTE) than that of Cu or Ni, which may facilitate the fusion bonding process between $Cu_3Sn$ interconnect structures 20 at the relatively low fusion bonding temperature. For example, the higher CTE of the $Cu_3Sn$ material may enhance exposure of the interconnect structure 20 relative to the bonding layer 16 during interconnect thermo-compressive or fusion processing (FIG. 2), and also may increase the contact pressure between opposing $Cu_3Sn$ interconnects due to such thermal expansion, which may thereby facilitate the inter-diffusion between the interconnect structures 20, 20' of the opposing stacked electrical devices 10, 10' (FIG. 2).

To determine an optimal way of forming the $Cu_3Sn$ interconnects 20 in the electrical device 10 at low temperatures, the present inventors experimented with different ways to form the $Cu_3Sn$ material by using low-temperature solid-state diffusion between individually deposited layers of Sn and Cu.

In a first experimental attempt, the inventors electrodeposited a layer of pure Cu into a via hole of a silicon substrate. Thereafter, a layer of Sn was sputtered atop the Cu layer. A post-deposition anneal to a temperature of 150° C. was then carried out by being vacuum annealed in-situ using heat lamps.

Figure 4:
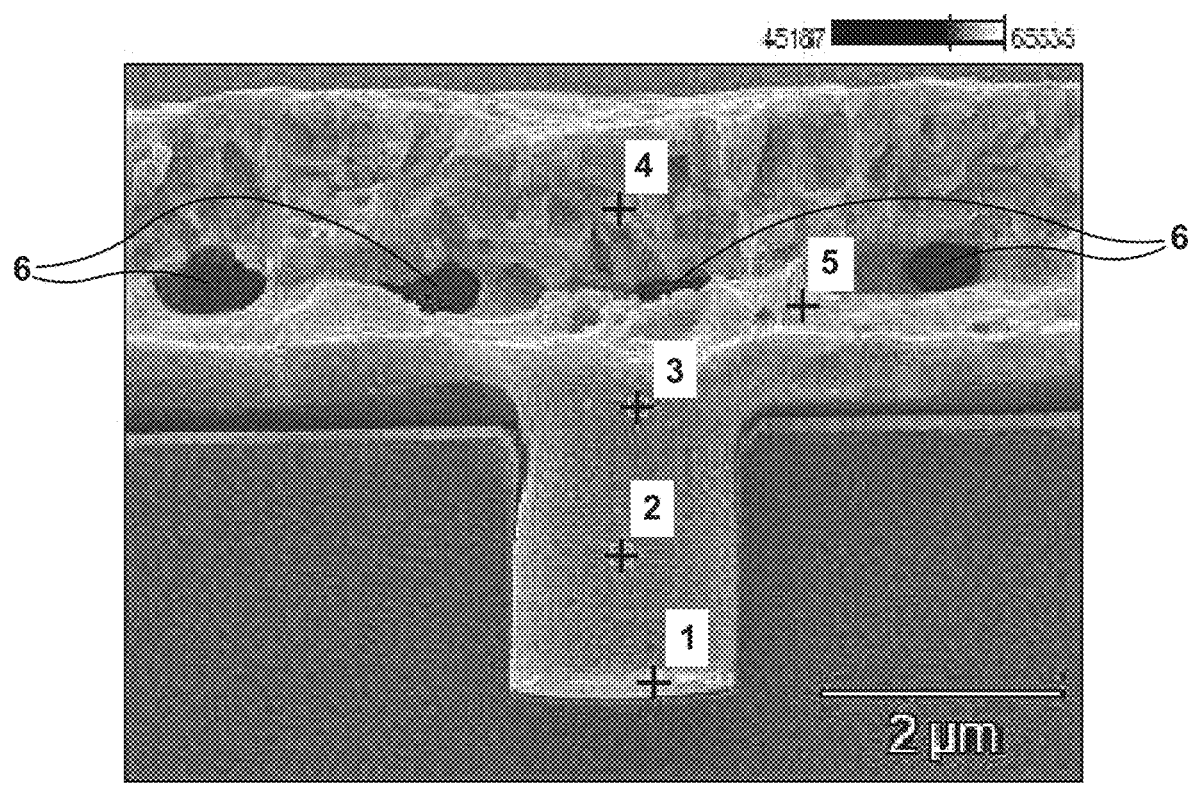
FIG. 4 is a scanning electron microscope image showing an interconnect structure according to a first comparative experimental attempt.

FIG. 4 is a scanning electron microscope (SEM) image of the structure resulting from the first experimental attempt. As shown at points 6 in FIG. 4, large Kirkendall voids were found in the experimental sample. The points #1 through #5 shown in FIG. 4 indicate locations where energy dispersive x-ray spectrometry (EDX) was used to determine the composition of the material that formed. Points #1, #2 and #3 were determined to be pure Cu. Points #4 and #5 were found to be $Cu_4Sn$, indicating that the diffusion reaction was likely starved of Sn. In summary, with the test parameters of the first experimental attempt, diffusion of Cu into the Sn layer is believed to continue until $Cu_4Sn$ is formed. In addition, large voids appear at the Cu:$Cu_4Sn$ interface, and no Sn is detectable by EDX in the remaining Cu layer. The $Cu_4Sn$ layer was found to have a rough, granular morphology.

In a second experimental attempt, the inventors electroplated a layer of pure Cu atop a flat layer on a silicon substrate. Thereafter, a layer of Sn was deposited using physical vapor deposition at a temperature of 100° C. for a time of 100 seconds, with the intent of forming the $Cu_3Sn$ material in situ during the depositing of the Sn.

Figure 5:
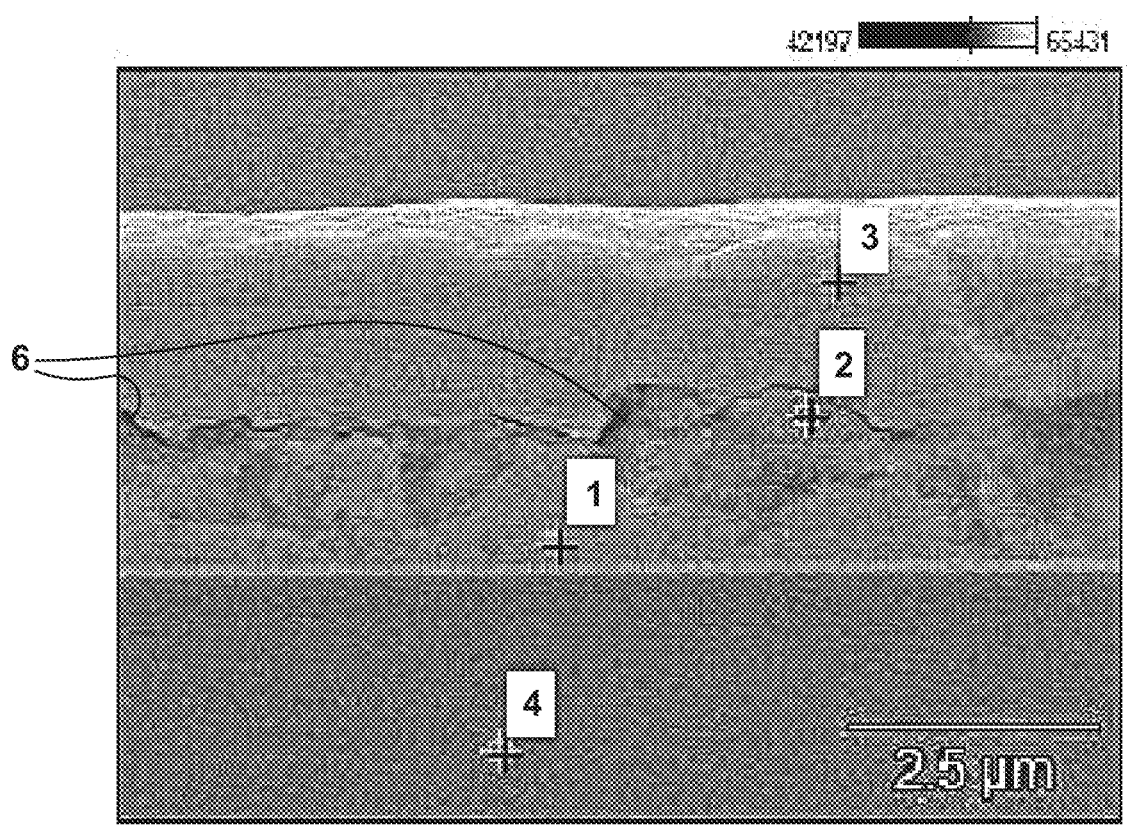
FIG. 5 is a scanning electron microscope image showing an interconnect structure according to a second comparative experimental attempt.

FIG. 5 is an SEM image of the structure resulting from the second experimental attempt. Small Kirkendall voids were found in the sample, as illustrated at point 6 in FIG. 5. The points #1 through #4 shown in FIG. 5 indicate locations where EDX was used to determine the composition of the material that formed. Point #1 was determined to be pure Cu. Point #2 was determined to be $Cu_{3.4}Sn$. Point #3 was determined to be $Cu_3Sn$. Point #4 was the silicon substrate. In summary, with the test parameters of the second experimental attempt, diffusion is believed to continue until the $Cu_3Sn$ intermetallic compound is formed. In addition, small voids appear at the Cu:$Cu_3Sn$ interface, and no Sn is detectable by EDX in the remaining Cu layer. The $Cu_3Sn$ layer was found to have a smooth, amorphous morphology.

Figure 6:
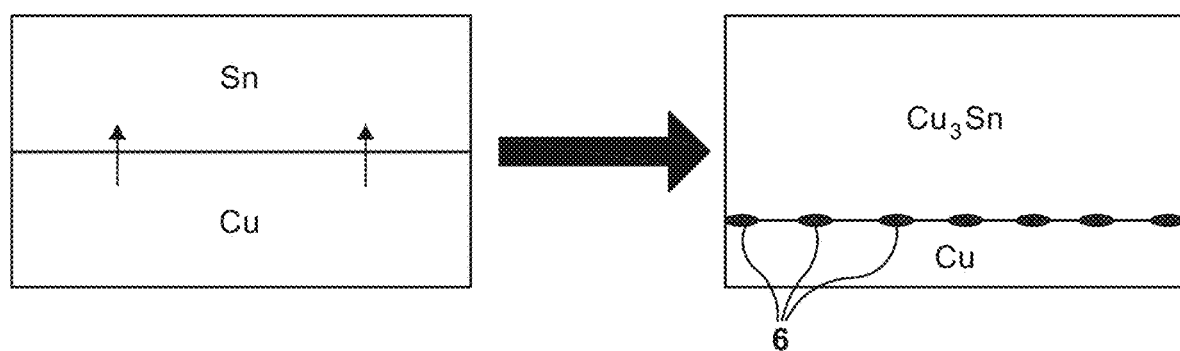
FIG. 6 is a schematic diagram depicting the diffusion mechanism that is believed to occur during the first and second comparative experimental attempts.

FIG. 6 is a schematic diagram depicting the diffusion mechanism that is believed to have occurred in the foregoing two experimental attempts. Based on the results of the experimental attempts, the present inventors found that at both 100° C. and 150° C., rapid solid-state diffusion between the Cu and the Sn layers will occur. At temperatures as low as 100° C. the Sn/Cu bilayer will exhibit diffusion of the Cu across the diffusion front into the Sn layer, with the diffusion front moving in the direction of the Cu layer. At this temperature, net diffusion halts once the Sn layer has been consumed to form a stable $Cu_3Sn$ intermetallic layer. Kirkendall voids 6 formed during the process are concentrated at the interface between the formed $Cu_3Sn$ and the remaining Cu layer. These Kirkendall voids are believed to form due to a vacancy diffusion mechanism, in which vacancies form as a result of the rapid diffusion of Cu relative to Sn, and are the nucleation sites of larger voids. These voids are problematic when they appear in areas of the interconnect structure that may cause mechanical weakening and/or minimize the electrical conductivity of the interconnect. More specifically, such voids are particularly problematic when they are formed deep within the interconnect layer, such as within the via hole where they cannot practically be removed without affecting the overall functionality of the interconnect structure.

Based on the results of these experimental attempts, the present inventors discovered that a void-free $Cu_3Sn$ intermetallic may be formed in the via holes if Sn is used as the first layer deposited in the via holes. More specifically, the inventors discovered that by first depositing the Sn layer into the via hole and then depositing the Cu layer atop and in contact with the Sn layer, the direction of Cu diffusion across the diffusion front when sufficiently heated will enable the $Cu_3Sn$ material to form in the via hole, while the diffusion front with any Kirkendall voids will move away from the formed $Cu_3Sn$ material toward the remaining Cu layer where the voids and remaining material can then be removed with conventional processing steps, such as by CMP (as shown in FIG. 1I, which is described in further detail below).

Referring to FIGS. 1E-1I, an exemplary process of forming the $Cu_3Sn$ interconnects 20 in the via holes 18 of the electrical device 10 is shown in further detail. As discussed above, the via hole 18 may be formed in the electrical device 10 in any suitable manner and at any suitable location, as may be desired depending on the particular application. For example, the $Cu_3Sn$ interconnect 20 may be formed in a via hole that is a blind hole, a through-hole, a hidden hole, a castellated hole, or any other suitable cavity or channel in the bonding layer 16 or other portion of the device 10.

Figure 3:
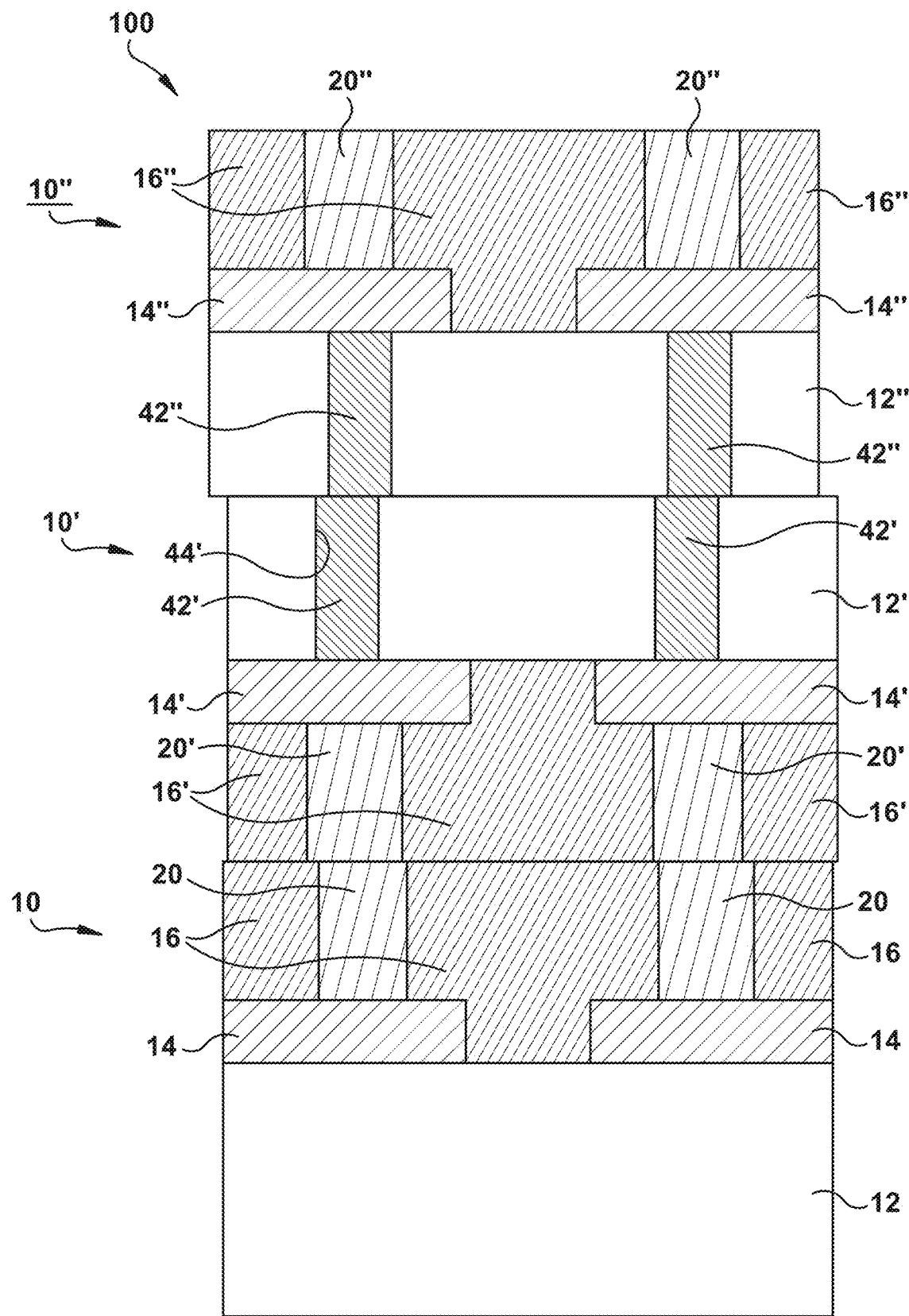
FIG. 3 is a schematic cross-section of the stacked electronic device assembly of FIG. 2 including exemplary vias and additional layers prepared for an additional stacking sequence.

In the illustrated embodiment, for example, the via hole 18 is formed as a blind hole in the bonding layer 16 (e.g., silicon dioxide layer) of the device 10, and extends vertically downward to the electrical trace 14 such that the $Cu_3Sn$ interconnect 20 formed therein can contact and electrically connect with the trace 14. The contact and/or electrical connection between the $Cu_3Sn$ interconnect 20 and trace 14 may be direct or indirect. For example, in an exemplary indirect electrical connection, an electrically conductive barrier layer (e.g., TiN, TiW, Ta, TaN) (not shown) may be interposed between the interconnect 20 and trace 14 to prevent interdiffusion therebetween. As shown in FIG. 3 and described in further detail below, $Cu_3Sn$ interconnects 20 may be formed in a via hole 18 that is a through-hole in the substrate 12 (e.g., silicon wafer) for use in coupling the electrical device 10 to another electrical device 10. Alternatively or additionally, $Cu_3Sn$ interconnects also could be formed in a via hole that leaves a free-standing interconnect structure during the process (not shown). For example, the $Cu_3Sn$ interconnect could be formed in a via hole that is etched into a photoresist layer that is later removed such that the $Cu_3Sn$ interconnect remains. Such a free-standing $Cu_3Sn$ interconnect could then be surrounded with the bonding layer or other suitable material thereafter, or could remain as a free-standing structure, for enabling 3D-integration to another electrical device.

FIG. 1E shows the process of depositing an Sn layer 22 in the via hole 18. In exemplary embodiments, the Sn layer 22 is formed completely of elemental Sn, although the Sn layer 22 could be formed essentially of Sn and contain other minor constituents or impurities in the Sn layer (e.g., 99.9% Sn or greater). The Sn layer 22 may be deposited at any suitable temperature. In exemplary embodiments, the Sn layer 22 is deposited at less than 80° C. (e.g., 50-80° C., such as 50° C., 60° C., 70° C. or 80° C.). The Sn layer 22 may be deposited by any suitable technique. In exemplary embodiments, the Sn layer is deposited by electroplating. Other suitable techniques may include: electrochemical deposition, evaporation, or metalorganic chemical vapor deposition, for example. As shown, the Sn layer 22 is deposited to completely fill the via hole 18. In exemplary embodiments, the Sn layer 22 also is deposited to extend above the via hole 18, which may include covering at least a portion of an upper surface of the layer having the via hole 18 (e.g., upper surface 24 of bonding layer 16). The overfill of the Sn layer 22 may be controlled to provide a quantity of the Sn layer 22 that is to be consumed by the Cu layer to form $Cu_3Sn$, such that the interface of any remaining Cu layer is at or above an upper portion of the via hole 18, and more preferably at or above the upper surface (e.g., 24) of the layer (e.g., 16) having the via hole 18.

FIG. 1F shows depositing a Cu layer 26 atop and in contact with the Sn layer 22. In exemplary embodiments, the Cu layer 26 is formed completely of elemental Cu, although the Cu layer 26 could be formed essentially of Cu and contain other minor constituents or impurities in the Cu layer (e.g., 99.9% Cu or greater). The Cu layer 26 may be deposited at any suitable temperature. In exemplary embodiments, the Sn layer 26 is deposited at less than 80° C. (e.g., 50-80° C., such as 50° C., 60° C., 70° C. or 80° C.). The Cu layer 26 may be deposited by any suitable technique. In exemplary embodiments, the Cu layer 26 is deposited by physical vapor deposition. Other suitable techniques may include: electrochemical deposition, evaporation, or metalorganic chemical vapor deposition, for example. As shown, the Cu layer 26 is deposited to cover at least a portion, and more particularly the entirety, of the upper surface of the Sn layer 22.

The amount of the Cu layer 26 deposited may be controlled to provide a sufficient quantity for the diffusion reaction with the Sn to form the $Cu_3Sn$ material in the via hole 18. More particularly, the amount of Cu deposited may be selected based on the proper stoichiometry (e.g., molar ratios) between the amount of Sn and the amount of Cu, and/or based on the thermodynamic properties (e.g., Gibbs free energy) at the processing conditions for the diffusion reaction, as would be understood by those having ordinary skill in the art. For example, based on the differences in molar volume between Sn and Cu, the Sn layer may be formed at 1 micron and the Cu layer may be formed at 1.3 microns to provide a proper stoichiometric ratio to achieve $Cu_3Sn$. These amounts may be adjusted while maintaining the same ratio depending on the desired thickness of the interconnect structure. In an alternative method, multiple Cu and Sn layers may be alternately deposited (e.g., Cu—Sn—Cu—Sn, etc.) for conversion to the $Cu_3Sn$ material. In such an alternative method, thin layers of Sn (e.g., 1,000 Angstroms for each Sn layer) are alternated with thin layers of Cu (e.g., 1,300 Angstroms for each Cu layer). This alternating pattern of Cu and Sn layers may be repeated until a desired thickness is achieved. Upon heating these layers to a suitable temperature, the $Cu_3Sn$ material is formed.

FIG. 1G shows heating of the Cu and Sn layers 26, 22, and forming the $Cu_3Sn$ material 20 in the via hole 18 by way of solid-state diffusion. It is understood that the Cu atoms in the Cu layer 26 will cross the diffusion front 28 at the interface between the layers 22, 26 (shown with arrows C) to form the $Cu_3Sn$ material 20 where the Sn layer once was. During this diffusion process, it is observed that the diffusion front 28 will move in the direction of the remaining Cu layer 26 (e.g., upwards in the illustrated embodiment, as shown with arrows F). The heating of the materials to drive the diffusion reaction may occur in any suitable temperature. The heating of the materials to drive the diffusion reaction may occur in any suitable manner. For example, the heating may be radiative heating (e.g., via a heat source, such as a laser or other photon source), convective heating (e.g., via an atmosphere, such as within a chamber of the PVD device, for example an inert atmosphere); and/or conductive heating (e.g., via a heater, such as an electric heater, in thermal communication with the substrate 12). The heating of the Cu and Sn layers 26, 22 may occur after deposition and cooling of the Cu layer 26 (FIG. 1F), or the heating of the layers 22, 26 may occur in situ during the deposition of the Cu layer. The heating may be at a suitable temperature for a desired amount of time to form the $Cu_3Sn$ layer 20. To avoid forming undesirable phases (such as $Cu_6Sn_5$ and $Cu_4Sn$), and to keep the formation of Kirkendall voids to a minimum, in preferred embodiments the heating temperature should be kept below 150° C. For example, the heating of the Cu and Sn layers 26, 22 (i.e., the Cu/Sn bilayer structure) to form the $Cu_3Sn$ interconnect 20 may be in the range from 100° C. to 150° C., more particularly in the range from 90° C. to 125° C., and more particularly in the range from 90° C. to 120° C. Preferably, the heating for forming the $Cu_3Sn$ interconnect 20 is less than or equal to 110° C., such as in the range from about 100° C. to about 110° C. More generally, an exemplary heating temperature for causing solid-state diffusion and formation of the $Cu_3Sn$ interconnect 20 may include: 90° C., 100° C., 125° C., or 150° C., including all values, ranges and subranges between the stated values.

Referring to FIG. 1H, because the diffusion rate of the Cu atoms across the diffusion front 28 is understood to be greater than the diffusion rate of Sn, vacancies are expected to form at the remaining Cu layer interface 30, which are the nucleation sites of larger voids 32 (i.e., Kirkendall voids 32). Because of this diffusion mechanism, a mass transfer of Cu atoms crosses the diffusion front 28 to form the $Cu_3Sn$ interconnect 20 in the via hole 18, while the diffusion front 28 with any Kirkendall voids will move away from the formed $Cu_3Sn$ material toward the remaining Cu layer 26. As shown in FIG. 1H, in exemplary embodiments the Sn and Cu layers 22, 26 may be formed such that the interface of any remaining Cu layer 26 after formation of the $Cu_3Sn$ interconnect 20 is at or above the upper portion of the via hole 18, and more preferably at or above the upper surface 24 of the bond layer 16, such that this voided and unreacted region may be easily removed.

Turning to FIG. 1I, an exemplary removal process, such as a chemical-mechanical polishing (CMP), may be used to remove any remnant layer containing voids or unreacted material (e.g., Cu layer 26) following the diffusion formation of the $Cu_3Sn$ interconnects 20. The removal process also may planarize at least a portion of the upper surface 24 of the bonding layer 16 in preparation for bonding to a bonding layer 16' of another electrical device 10' (FIG. 2). The removal process also may expose outwardly addressable faces 34 of one or more of the $Cu_3Sn$ interconnects 20 in preparation for fusion bonding to corresponding $Cu_3Sn$ interconnects 20' the other electrical device 10' (FIG. 2). As shown in the illustrated embodiment, the bonding layer 16 and $Cu_3Sn$ interconnects 20 have been polished to have respective upper surfaces that are coplanar with each other. The height of the $Cu_3Sn$ interconnects 20 relative to the upper surface of the substrate 12 may also be controlled with the polishing process. The CMP process typically has a number of process variables including but not limited to the type of polishing slurry, rate of slurry addition, polishing pad, polishing pad oration rate, and polishing pressure. The $Cu_3Sn$ material used for the interconnects 20 and/or type of material for the bonding layer 28 may further affect the CMP process. These variables may be optimized to control the height of $Cu_3Sn$ interconnects 20 and bonding layer 16 relative to the upper surface of the substrate 12, and may also be optimized to provide optimal surface roughness for the upper surface of the bonding layer 16 and/or the addressable faces 34 of the $Cu_3Sn$ interconnects 20.

Turning to FIG. 2, after the upper surfaces of the bonding layer 16 and/or the $Cu_3Sn$ interconnects 20 have been prepared (as shown in FIG. 1I, for example), the exemplary electrical device 10 may be ready to be vertically stacked and hybrid bonded with another electrical device 10'. The other (second) electrical device 10' may be substantially the same as the exemplary electrical device 10, or the other electrical device may be different. For example, the second electrical device 10' may be another semiconductor device of a different size, have a different function, or be made of different materials, all of which may be selected depending on the design considerations as understood by those having skill in the art. It is further understood that the exemplary electrical device 10 (e.g., semiconductor device) may be vertically stacked and hybrid bonded with a non-semiconductor device, or with other active or passive electrical devices. In the illustrated embodiment, the second electrical device 10' is substantially the same as the above-referenced electrical device 10, and consequently the same reference numerals but with a prime are used to denote the same or similar structures. In addition, the foregoing description of the exemplary electrical device 10, including the exemplary fabrication method thereof, is equally applicable to the second electrical device 10'.

Referring to FIG. 2, during the initial contacting of the two electrical devices 10, 10' at room temperature, the respective interconnects 20, 20' are aligned, and at least a portion of each of the opposing surfaces of the devices 10, 10' may conform to each other by elastic deformation. Thereafter, hybrid bonding may occur between the opposing contact surfaces of each device 10, 10'. In this manner, at least a portion of each of the opposing bonding layers 10, 10' may bond together, and one or more of the opposing interconnects 20, 20' may be contacted or bond together to form an electrical interconnection between the adjoining electrical devices 10, 10', which thereby forms a 3D-integrated (e.g., vertically stacked) electrical assembly 100. Generally, such hybrid bonding refers to forming the direct oxide bond and the thermo-compressive bond between interconnects simultaneously; whereas direct bonding generally refers to bonding oxide layers together directly using no additional materials; and whereas thermo-compressive bonding alone generally refers to bonding metallic layers together using a combination of pressure and heat.

More specifically, as the opposing bonding layers 16, 16' contact at room temperature, the contacting (e.g., silicon dioxide) regions of the bonding layer may begin to form a bond at the contact point or points. The attractive bonding force between the electrical devices 10, 10' increases as the contact bonding area increases. A chemical bond may develop between the opposing surfaces of each bonding layer 16, 16', which may be a covalent bond that reacts across surface elements to form a high bond strength that approaches, for instance, the fracture strength of the electrical device materials. The formation of the chemical bond between bonding layers 16, 16' may be accelerated by a temperature treatment, for example, a low-temperature treatment of between about 100° C. to 200° C., more preferably from 100° C. to 150° C., such as 100° C., 125° C., 150° C., 175° C., 200° C., or 250° C., including all values, ranges and subranges between the stated values.

As discussed above, at these relatively low temperatures (e.g., 100° C. to 200° C., more preferably from 100° C. to 150° C.) the $Cu_3Sn$ interconnect material also is expected to form reliable fusion bonds between the respective $Cu_3Sn$ interconnects 20, 20' by way of interdiffusion between the contacting portions 34, 34' of the interconnects 20, 20'. For example, fusion bonding between the $Cu_3Sn$ interconnects 20, 20' may be carried out at a temperature of 50° C., 75° C., 100° C., 125° C., 150° C., 175° C., 200° C., or 250° C., including all values, ranges and subranges between the stated values. In exemplary embodiments, such fusion bonding of the interconnects 20, 20' may occur during the low-temperature treatment used for advancing chemical bonding of the bonding layers 16, 16'. The ability to fusion bond the $Cu_3Sn$ interconnects 20, 20' at the same time as bonding the bonding layers 16, 16' thereby eliminates extra heating steps that are typically required for conventional materials (e.g., high-temperature anneals of 300° C. or more for Ni or Cu interconnects). It is understood, however, that the heating step for fusion bonding the interconnects 20, 20' may be performed after bonding of the bonding layers 16, 16'. It is also understood that the fusion bonding process is thermodynamically driven, and thus extending the time of the low-temperature fusion bonding step may promote grain growth between the $Cu_3Sn$ interconnects 20, 20' which may result in a preferable low-resistance electrical connection. Furthermore, due to the higher coefficient of thermal expansion of the $Cu_3Sn$ interconnects 20, 20', the pressure generated by the device-to-device bonding during the low-temperature heat treatment may result in a compression force that further brings the $Cu_3Sn$ interconnects 20, 20' into intimate contact at their respective faces 34, 34'. In this manner, a strong metallic bond may be formed between the intimately contacted $Cu_3Sn$ interconnects 20, 20' due to interdiffusion or self-diffusion of metal atoms at the mating interface between the opposing interconnects 20, 20'. It is understood that the low-temperature treatment(s) may be carried out with a variety of heating methods, including but not limited to thermal, infrared, and inductive. Examples of thermal heating include in-situ vacuum annealing immediately after Cu deposition (using a heated substrate holder or backside infrared heating, oven, Rapid Thermal Processor, belt furnace, and hot plate. An example of infrared heating is rapid thermal annealing.

Turning to FIG. 3, the exemplary process may repeat again on an opposite side of the electrical device 10' (upper side, as shown) with essentially the same or similar steps described above for the electrical device 10. As shown in the illustrated embodiment, the second electrical device 10' may undergo further preparation at some point during the exemplary process to form one or more electrically conductive interconnects 42' in the form of through-vias (also referred to with reference numeral 42') that extend through the substrate 12'. In exemplary embodiments, the through-vias 42' may be formed after completion of the integration stacking sequence of the first two electrical devices 10, 10'. The through-vias 42' may be configured to electrically connect interconnects 20' and/or traces 14' on opposite sides of the substrate 12', or may connect traces, circuits, devices or other features disposed in the substrate (not shown). These interconnect structures (through-vias 42') also may be formed as $Cu_3Sn$ interconnects using the exemplary solid-state diffusion method described above for $Cu_3Sn$ interconnects 20, 20'. For example, through-via holes 44' for forming the $Cu_3Sn$ through-vias 42' may be formed in the substrate 12' by any suitable method, such as photolithography and/or etching. An Sn layer may be deposited in the through-via hole 44', preferably with some of the Sn layer protruding above the through-via hole, such as atop an upper surface of the substrate 12'. A Cu layer may be deposited atop and in contact with the Sn layer. The Cu/Sn bilayer structure may be heated to cause solid-state diffusion and formation of the $Cu_3Sn$ interconnect structure (through-via 42') in the through-via hole. A removal step (e.g., CMP) may be used to prepare the upper surface of the substrate 12' and remove any remaining unreacted material or voids from the interconnect structure.

As shown in FIG. 3, a third exemplary electrical device 10" is shown contacting and direct bonding with the top of the exemplary second electrical device 10'". Such direct bonding may be by way of fusion bonding with the through-via (interconnects 42', 42") and/or with a bonding layer as would be understood by those having ordinary skill in the art. In the illustrated embodiment, the third electrical device 10" is substantially the same as the above-referenced first and second electrical devices 10 and 10', and consequently the same reference numerals but with double primes are used to denote the same or similar structures. In addition, the foregoing description of the exemplary electrical devices 10 and 10', including the exemplary fabrication method thereof, is equally applicable to the third electrical device 10". It is understood, however, that the third electrical device 10", or any other additional electrical device bonded to the stacked sequence may be different. This process of hybrid bond and/or direct bond integration may be repeated as many times as desired and practical with additional electrical devices, as would be understood by those having ordinary skill in the art.

An exemplary $Cu_3Sn$ electrical interconnect and method of making same in an exemplary electrical device, such as for hybrid bond 3D-integration has been described herein. The exemplary electrical device formed by the above-described process provides conductive metal vias (interconnects) formed with a $Cu_3Sn$ material having acceptable electrical conductivity that is similar to that of other conventional interconnect materials, such as Ni and In. The $Cu_3Sn$ interconnect material also has sufficient hardness making it compatible with conventional CMP removal processes, unlike softer materials such as pure Sn and In. The $Cu_3Sn$ interconnect material also is corrosion resistant, thereby minimizing the growth of native oxides that may be formed at the externally addressable face (e.g., fusion bonding interface) of the interconnect during processing, such as during CMP. This, in turn, may minimize the temperature needed for fusion bonding the $Cu_3Sn$ interconnect with the $Cu_3Sn$ interconnect of another device, unlike pure Cu interconnects that form stable oxides and thus require higher than expected fusion bonding temperatures. Such low-temperature fusion bonding of the opposing $Cu_3Sn$ interconnects thereby enables a wider variety of temperature-sensitive materials (e.g., HgCdTe) to be used, which expands the ability for temperature-sensitive devices (e.g., infrared sensors) to be integrated using the hybrid bond process. The $Cu_3Sn$ interconnect material also has a higher coefficient of thermal expansion than that of Cu or Ni, which may facilitate the fusion bonding process by causing the $Cu_3Sn$ interconnect to increase contact pressure with the opposing $Cu_3Sn$ interconnect of the other electrical device at the preferred temperatures.

Furthermore, the exemplary process described above provides a unique approach of forming the $Cu_3Sn$ interconnect(s) in the via hole(s) by using low-temperature solid-state diffusion between individually deposited layers of Sn and Cu. In particular, by first depositing the Sn layer into the via hole and then depositing the Cu layer atop the Sn layer, the diffusion of Cu atoms across the diffusion front when heated will form the $Cu_3Sn$ material in the via hole, while the diffusion front with any Kirkendall voids will move away from the formed $Cu_3Sn$ material toward the remaining Cu layer where the voids and any remaining material can then be removed. In other words, the diffusion front is established above the top of the via hole and progresses upward during $Cu_3Sn$ formation, thereby isolating unreacted Cu and any Kirkendall voids in a layer that will be removed. Such a unique process enables a void-free interconnect structure made completely of $Cu_3Sn$ to form in the via hole at relatively low-temperatures, thereby enabling the use of temperature-sensitive materials and/or temperature sensitive electrical devices to be 3D-integrated using the hybrid bond process.

Although a preferred method for forming $Cu_3Sn$ interconnect structures has been described above, more generally an aspect of the present disclosure provides a $Cu_3Sn$ electrical conductor which may be formed by any suitable manufacturing technique in any suitable location on any suitable electrical device. Exemplary advantages of such $Cu_3Sn$ electrical structure include a very low activation energy for self-diffusion, which is about 6.23 eV. This value represents the minimum energy required (e.g., in the form of heat) that is required to start the self-diffusion process between two $Cu_3Sn$ surfaces in intimate contact. In contrast, the activation energies for self-diffusion in In, Cu, and Ni are about 0.809, 2.14, and 3.03 eV, respectively. The negative of activation energy is exponentially related to the physical diffusion rate constant, so the rate of self-diffusion in $Cu_3Sn$ can be 20% higher than In at 100° C., and 450%, and 1100% higher than copper or nickel at 150° C. The $Cu_3Sn$ material also has physical properties that are better than those of In, in particular with respect to CMP. For instance, $Cu_3Sn$ is about as hard as Cu and 16 times harder than In. The $Cu_3Sn$ material has a Poisson's Ratio that is about 90% of Cu or Ni, and half that of In, making it the easiest of this group to polish without smearing.

The $Cu_3Sn$ material may be formed by any suitable manufacturing technique. For example, the $Cu_3Sn$ may be formed by a vapor deposition technique (e.g., PVD, CVD, etc.) using a $Cu_3Sn$ source material or combination of materials that form the proper stoichiometric $Cu_3Sn$ on a substrate, in a via hole, or the like. Such processes may include co-sputtering Sn and Cu so that the resulting deposited film has the molar ratio 3:1. This could be accomplished by sputtering from separate Sn and Cu targets, or by sputtering from a single target made of Sn and Cu in a ratio that resulted in a $Cu_3Sn$ film. Similarly, Sn and Cu could be deposited by electroplating from Cu—Sn solution if a film with the proper stoichiometric molar ratio 3Cu:1Sn was achieved. Such a plating method could be used to plate the $Cu_3Sn$ material on a substrate, in a via hole, or the like.

The $Cu_3Sn$ material may be formed by any suitable technique at any suitable location of a device. For example, the $Cu_3Sn$ material may be deposited, plated, formed, etc. in a via hole, such as within a bonding layer as described above or within another suitable substrate layer. Alternatively or additionally, the $Cu_3Sn$ material may be formed atop a substrate or any suitable layer.

The exemplary method of depositing, plating, forming, etc. may be carried out a relatively low temperatures, such as 100-200° C., more particularly about 100-150° C., or at any of the foregoing temperatures described above. Such a technique may avoid raising the temperature to above the melting temperature of Sn (232° C.), which in such elevated temperature regimes would form a liquid and result in rapid diffusion and intermetallic compound formation, also referred to as "transient liquid phase" (TLP). A common drawback of TLP is the formation of Kirkendall Voids as well as other Cu—Sn intermetallics such as $Cu_6Sn_5$ that have inferior electrical and mechanical properties compared to $Cu_3Sn$. Another advantage of such a low-temperature technique for forming $Cu_3Sn$ is that it may enable a greater variety of materials (e.g., temperature sensitive materials, such as HCT) and/or devices (e.g., infrared sensors) to be used in such 3D integration techniques. Accordingly, the exemplary $Cu_3Sn$ interconnect and low-temperature method of making same may be beneficially adapted to be used in many different applications.

In view of the foregoing, an aspect of the present disclosure provides a $Cu_3Sn$ electrical structure for an electronic device.

Another aspect of the present disclosure provides a method of forming a $Cu_3Sn$ electrical structure for an electronic device.

According to another aspect of the present disclosure, a method of forming an electrical interconnect in a via hole of an electrical device includes: depositing a Sn layer in the via hole; depositing a Cu layer atop and in contact with the Sn layer; and heating the Sn layer and the Cu layer such that the Sn and Cu layers diffuse together to form a $Cu_3Sn$ interconnect in the via hole; wherein during the heating, a diffusion front between the Sn and Cu layers moves in a direction toward the Cu layer initially deposited.

According to another aspect of the present disclosure, a method of making an electrical device includes: providing a substrate; forming an electrically conductive trace at least partially overlying the substrate; forming a bonding layer at least partially overlying the electrically conductive trace; forming a via hole in the bonding layer; and forming a $Cu_3Sn$ interconnect in the via hole according to the foregoing method.

According to another aspect of the present disclosure, a method of making a 3D-integrated electrical device assembly includes: making at least two electrical devices according to the foregoing method; and bonding the at least two electrical devices together at their respective bonding layers.

According to another aspect of the present disclosure, a method of forming an electrical device includes: forming a first $Cu_3Sn$ interconnect on a first electrical device subassembly; forming a second $Cu_3Sn$ interconnect on a second electrical device subassembly; and coupling the first $Cu_3Sn$ interconnect to the second $Cu_3Sn$ interconnect.

According to another aspect of the present disclosure, an electrical device includes: a substrate; an electrically conductive trace at least partially overlying the substrate; an electrically conductive interconnect disposed in a via hole, wherein the electrically conductive interconnect is electrically connected to the trace; and a bonding layer at least partially surrounding the interconnect and at least partially overlying the substrate; wherein the electrically conductive interconnect is made of $Cu_3Sn$.

According to another aspect of the present disclosure, an electrical device includes: a first electrical device section having a first $Cu_3Sn$ interconnect; and a second electrical device section having a second $Cu_3Sn$ interconnect; wherein the first $Cu_3Sn$ interconnect is coupled to the second $Cu_3Sn$ interconnect to form a single $Cu_3Sn$ interconnect structure.

Embodiment(s) according to the present disclosure may include one or more features of the foregoing aspects, separately or in any combination, which may be combined with one or more of the following additional features, which may be included separately or in any combination.

In some embodiments, the heating causes solid state diffusion between the Sn and Cu layers.

In some embodiments, the heating causes Cu atoms in the Cu layer to diffuse across the diffusion front into the Sn layer to form the $Cu_3Sn$ interconnect.

In some embodiments, the heating causes vacancy diffusion and the formation of Kirkendall voids at an interface between the formed $Cu_3Sn$ interconnect and remaining Cu layer; and wherein the method is carried out such that the Kirkendall voids are at an upper portion of the via hole or above an upper surface of a layer in which the via hole is formed.

In some embodiments, the method further comprising: removing the Kirkendall voids and the remaining Cu layer.

In some embodiments, the heating includes heating to a temperature in a range from 100° C. to 200° C., more preferably in a range from 100° C. to 150° C.

In some embodiments, the heating and diffusion is carried out after the depositing the Cu layer.

In some embodiments, the heating and diffusion is carried out during the depositing the Cu layer.

In some embodiments, the Sn layer is deposited by electroplating.

In some embodiments, the Sn layer is deposited to completely fill the via hole.

In some embodiments, the Sn layer is deposited to overlie at least a portion of an upper surface of a layer in which the via hole is formed.

In some embodiments, the Cu layer is deposited by physical vapor deposition.

In some embodiments, the via hole is formed in at least a portion of a bonding layer of the electrical device and the $Cu_3Sn$ interconnect is formed in the via hole such that the $Cu_3Sn$ interconnect is at least partially surrounded by the bonding layer.

In some embodiments, the bonding layer is made of a silicon dioxide material.

In some embodiments, the method further comprising: chemical-mechanical polishing an upper surface of the bonding layer to planarize the $Cu_3Sn$ interconnect with the bonding layer; wherein the chemical-mechanical polishing includes removing Kirkendall voids that formed during the formation of the $Cu_3Sn$ interconnect.

In some embodiments, the method further comprising: fusion bonding together the respective $Cu_3Sn$ interconnects of the at least two electrical devices.

In some embodiments, the formation of the respective $Cu_3Sn$ interconnects occurs at a first temperature, the bonding of the respective bonding layers occurs at a second temperature, and the fusion bonding of the respective $Cu_3Sn$ interconnects occurs at a third temperature; wherein a temperature span between the first and second temperatures is in a range from 25° C. to 100° C., more particularly in a range from 25° C. to 75° C.; and wherein a temperature span between the second and third temperatures is in a range from 0° C. to 100° C., more particularly in a range from 0° C. to 50° C.

In some embodiments, the electrically conductive interconnect is made by solid state diffusion between a layer of Cu and layer of Sn.

In some embodiments, the bonding layer is made of a silicon oxide material.

In some embodiments, the first $Cu_3Sn$ interconnect is coupled to the second $Cu_3Sn$ interconnect at a temperature in a range from 100° C. to 200° C., more preferably in a range from 100° C. to 150° C.

In some embodiments, the first and second electrical device subassemblies include respective first and second bonding layers, the method further comprising bonding the electrical devices together at their respective bonding layers, wherein the bonding is carried out at a temperature in a range from 100° C. to 200° C., more preferably in a range from 100° C. to 150° C.

In some embodiments, forming the $Cu_3Sn$ interconnect includes: PVD, CVD such as using a $Cu_3Sn$ target, or electroplating such as using a $Cu_3Sn$ solution.

In some embodiments, each step of the 3D-integration process is carried out at a temperature in a range from 25° C. to 200° C., more preferably in a range from 50° C. to 150° C.

In some embodiments, the interconnect is formed on top of a substrate or surface, in a via hole, and/or extends through multiple layers of an integrated circuit.

In some embodiments, alternating Cu and Sn layers are deposited (e.g., Cu—Sn—Cu—Sn, etc.), and wherein the alternating Cu and Sn layers are reacted to form a $Cu_3Sn$ structure.

In some embodiments, the alternating Cu layers each have a thickness of about 1,300 Angstroms and the alternating Sn layers have a thickness of about 1,000 Angstroms.

In some embodiments, the interconnect according to any of the preceding is absent voids and is made entirely of $Cu_3Sn$.

It is understood that all ranges and ratio limits disclosed in the specification and claims may be combined in any manner. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The transitional words or phrases, such as "comprising," "including," "carrying," "having," "containing," "involving," "holding," and the like, are to be understood to be open-ended, i.e., to mean including but not limited to.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming an electrical interconnect in a via hole of an electrical device, the method comprising:
   depositing a Sn layer in the via hole;
   depositing a Cu layer atop and in contact with the Sn layer; and
   heating the Sn layer and the Cu layer such that the Sn and Cu layers diffuse together to form a $Cu_3Sn$ interconnect in the via hole;
   wherein during the heating, a diffusion front between the Sn and Cu layers moves in a direction toward the Cu layer initially deposited;
   wherein the heating causes Cu atoms in the Cu layer to diffuse across the diffusion front into the Sn layer to form the $Cu_3Sn$ interconnect;
   wherein the heating causes vacancy diffusion and the formation of Kirkendall voids at an interface between the formed $Cu_3Sn$ interconnect and remaining Cu layer; and
   wherein the method is carried out such that the Kirkendall voids are at an upper portion of the via hole or above an upper surface of a layer in which the via hole is formed; and
   further comprising: removing the Kirkendall voids and the remaining Cu layer.

2. The method according to claim 1, wherein the heating includes heating to a temperature in a range from 100° C. to 200° C., more preferably in a range from 100° C. to 150° C.

3. The method according to claim 1, wherein the heating and diffusion is carried out after the depositing the Cu layer.

4. The method according to claim 1, wherein the Sn layer is deposited to completely fill the via hole.

5. The method according to claim 4, wherein the Sn layer is deposited to overly at least a portion of an upper surface of a layer in which the via hole is formed.

6. The method according to claim 1, wherein the heating and diffusion is carried out during the depositing the Cu layer.

7. A method of forming an electrical interconnect in a via hole of an electrical device, the method comprising:
   depositing a Sn layer in the via hole;
   depositing a Cu layer atop and in contact with the Sn layer; and
   heating the Sn layer and the Cu layer such that the Sn and Cu layers diffuse together to form a $Cu_3Sn$ interconnect in the via hole;
   wherein during the heating, a diffusion front between the Sn and Cu layers moves in a direction toward the Cu layer initially deposited; and
   wherein the Sn layer is deposited to completely fill the via hole.

8. The method according to claim 7, wherein the heating causes solid state diffusion between the Sn and Cu layers.

9. The method according to claim 7,
   wherein the heating causes Cu atoms in the Cu layer to diffuse across the diffusion front into the Sn layer to form the $Cu_3Sn$ interconnect;
   wherein the heating causes vacancy diffusion and the formation of Kirkendall voids at an interface between the formed $Cu_3Sn$ interconnect and remaining Cu layer; and
   wherein the method is carried out such that the Kirkendall voids are at an upper portion of the via hole or above an upper surface of a layer in which the via hole is formed.

10. The method according to claim 7, wherein the Sn layer is deposited by electroplating.

11. The method according to claim 7, wherein the Sn layer is deposited to overly at least a portion of an upper surface of a layer in which the via hole is formed.

12. The method according to claim 7, wherein the Cu layer is deposited by physical vapor deposition.

13. The method according to claim 7, wherein the via hole is formed in at least a portion of a bonding layer of the electrical device and the $Cu_3Sn$ interconnect is formed in the via hole such that the $Cu_3Sn$ interconnect is at least partially surrounded by the bonding layer.

14. The method according to claim 7, wherein the bonding layer is made of a silicon dioxide material.

15. The method according to claim 7, wherein the heating includes heating to a temperature in a range from 100° C. to 200° C., more preferably in a range from 100° C. to 150° C.

16. A method of making an electrical device, comprising:
   providing a substrate;
   forming an electrically conductive trace at least partially overlying the substrate;
   forming a bonding layer at least partially overlying the electrically conductive trace;
   forming a via hole in the bonding layer; and
   forming a $Cu_3Sn$ interconnect in the via hole according to a method that includes:
   depositing a Sn layer in the via hole;

depositing a Cu layer atop and in contact with the Sn layer; and heating the Sn layer and the Cu layer such that the Sn and Cu layers diffuse together to form a Cu$_3$Sn interconnect in the via hole;

wherein during the heating, a diffusion front between the Sn and Cu layers moves in a direction toward the Cu layer initially deposited;

further comprising: chemical-mechanical polishing an upper surface of the bonding layer to planarize the Cu$_3$Sn interconnect with the bonding layer;

wherein the chemical-mechanical polishing includes removing Kirkendall voids that formed during the formation of the Cu$_3$Sn interconnect.

17. A method of making a 3D-integrated electrical device assembly, comprising:

making at least two electrical devices according to the method of claim 16; and bonding the at least two electrical devices together at their respective bonding layers.

18. A method of making a 3D-integrated electrical device assembly, comprising:

making at least two electrical devices according to a method that includes:

providing a substrate;

forming an electrically conductive trace at least partially overlying the substrate;

forming a bonding layer at least partially overlying the electrically conductive trace;

forming a via hole in the bonding layer; and forming a Cu$_3$Sn interconnect in the via hole according to a method that includes:

depositing a Sn layer in the via hole;

depositing a Cu layer atop and in contact with the Sn layer; and heating the Sn layer and the Cu layer such that the Sn and Cu layers diffuse together to form a Cu$_3$Sn interconnect in the via hole;

wherein during the heating, a diffusion front between the Sn and Cu layers moves in a direction toward the Cu layer initially deposited; and bonding the at least two electrical devices together at their respective bonding layers; and further comprising: fusion bonding together the respective Cu$_3$Sn interconnects of the at least two electrical devices.

19. The method according to claim 18, wherein the formation of the respective Cu$_3$Sn interconnects occurs at a first temperature, the bonding of the respective bonding layers occurs at a second temperature, and the fusion bonding of the respective Cu$_3$Sn interconnects occurs at a third temperature;

wherein a temperature span between the first and second temperatures is in a range from 25° C. to 100° C., more particularly in a range from 25° C. to 75° C.; and wherein a temperature span between the second and third temperatures is in a range from 0° C. to 100° C., more particularly in a range from 0° C. to 50° C.

20. The method of claim 18, wherein the fusion bonding includes interdiffusion between contacting portions of the respective Cu$_3$Sn interconnects.

* * * * *